(12) United States Patent
Kapusta et al.

(10) Patent No.: US 11,503,704 B2
(45) Date of Patent: Nov. 15, 2022

(54) SYSTEMS AND METHODS FOR HYBRID GLASS AND ORGANIC PACKAGING FOR RADIO FREQUENCY ELECTRONICS

(71) Applicant: General Electric Company, Schenectady, NY (US)

(72) Inventors: Christopher James Kapusta, Delanson, NY (US); Stanton Earl Weaver, Jr., Broadalbin, NY (US); Joseph Alfred Iannotti, Glenville, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 16/730,435

(22) Filed: Dec. 30, 2019

(65) Prior Publication Data

US 2021/0204397 A1  Jul. 1, 2021

(51) Int. Cl.
*H05K 1/02*     (2006.01)
*H05K 1/03*     (2006.01)
(Continued)

(52) U.S. Cl.
CPC ......... *H05K 1/0243* (2013.01); *H05K 1/0271* (2013.01); *H05K 1/0306* (2013.01);
(Continued)

(58) Field of Classification Search
CPC .. H05K 1/02; H05K 1/03; H05K 1/09; H05K 1/11; H05K 1/14; H05K 1/16; H05K 1/18;
(Continued)

(56) References Cited

U.S. PATENT DOCUMENTS 5,276,412 A * 1/1994 Yoneda ............... H01P 1/2053
                                             333/219.1
5,610,521 A * 3/1997 Zou ...................... G01R 33/34
                                             324/318

(Continued)

FOREIGN PATENT DOCUMENTS

CN          107482470 A     12/2017

OTHER PUBLICATIONS

Parmar et al., "Glass Packaging for RF MEMS", IMAPS 2018—51st International Symposium on Microelectronics, Pasadena, CA, Oct. 8-11, 2018, vol. 2018; Issue: 1; pp. 680-684.

(Continued)

*Primary Examiner* — Xiaoliang Chen
(74) *Attorney, Agent, or Firm* — Armstrong Teasdale LLP

(57) ABSTRACT

An electronics package is disclosed. The electronics package includes a first radio frequency (RF) substrate layer, a second RF substrate layer, and a plurality of conductive layers disposed adjacent to at least one of the first RF substrate layer and the second RF substrate layer and including an inner conductive layer disposed between and adjacent to both the first RF substrate layer and the second RF substrate layer. The inner conductive layer bonds the first RF substrate layer to the second RF substrate layer. The electronics package also includes a plurality of conductive interconnects extending through the first RF substrate layer and the second RF substrate layer and electrically coupled between at least two of the plurality of conductive layers.

14 Claims, 5 Drawing Sheets

(51) Int. Cl.

| | |
|---|---|
| *H05K 1/09* | (2006.01) |
| *H05K 1/11* | (2006.01) |
| *H05K 1/14* | (2006.01) |
| *H05K 1/16* | (2006.01) |
| *H05K 1/18* | (2006.01) |
| *H05K 3/10* | (2006.01) |
| *H05K 3/32* | (2006.01) |
| *H05K 3/36* | (2006.01) |
| *H05K 3/42* | (2006.01) |
| *H05K 3/46* | (2006.01) |
| *H01L 21/02* | (2006.01) |
| *H01L 21/48* | (2006.01) |
| *H01L 21/50* | (2006.01) |
| *H01L 21/56* | (2006.01) |
| *H01L 23/00* | (2006.01) |
| *H01L 23/12* | (2006.01) |
| *H01L 23/13* | (2006.01) |
| *H01L 23/16* | (2006.01) |
| *H01L 23/31* | (2006.01) |
| *H01L 23/48* | (2006.01) |
| *H01L 23/52* | (2006.01) |
| *H01L 23/58* | (2006.01) |
| *H01L 23/66* | (2006.01) |
| *H01L 23/485* | (2006.01) |
| *H01L 23/498* | (2006.01) |
| *H01L 23/538* | (2006.01) |

(52) U.S. Cl.
CPC ............ *H05K 1/115* (2013.01); *H05K 3/462* (2013.01); *H05K 3/4605* (2013.01); *H05K 3/4688* (2013.01); *H01L 23/66* (2013.01); *H01L 2223/6683* (2013.01); *H05K 1/0313* (2013.01); *H05K 1/16* (2013.01); *H05K 3/32* (2013.01); *H05K 2201/068* (2013.01); *H05K 2201/10098* (2013.01)

(58) Field of Classification Search
CPC .. H05K 3/10; H05K 3/36; H05K 3/42; H05K 3/46; H01L 23/00; H01L 23/12; H01L 23/13; H01L 23/16; H01L 23/31; H01L 23/48; H01L 23/52; H01L 23/58; H01L 23/66; H01L 23/485; H01L 23/498; H01L 23/538
USPC ............. 361/782, 277, 728, 736, 761, 764; 174/782, 277, 728, 736, 761, 764, 252, 174/256–258, 260; 333/21 R, 24 R, 26; 257/691, 700, 750, 766, 774; 455/8, 334, 455/575.1, 78
See application file for complete search history.

(56) References Cited

U.S. PATENT DOCUMENTS

| | | | | |
|---|---|---|---|---|
| 6,194,900 B1* | 2/2001 | Freeman | ............... | G01R 33/302 |
| | | | | 324/318 |
| 6,611,230 B2 | 8/2003 | Phelan | | |
| 7,271,767 B2 | 9/2007 | Londre | | |
| 7,535,728 B2 | 5/2009 | Chakravorty et al. | | |
| 8,034,666 B2 | 10/2011 | Samples | | |
| 8,273,671 B2* | 9/2012 | Leib | ............... | H01L 23/66 |
| | | | | 501/66 |
| 9,761,514 B2* | 9/2017 | Ma | ............... | H05K 3/42 |
| 2003/0020173 A1* | 1/2003 | Huff | ............... | H01P 1/184 |
| | | | | 257/774 |
| 2003/0060172 A1* | 3/2003 | Kuriyama | ............... | H05K 1/0206 |
| | | | | 455/575.1 |
| 2003/0063427 A1* | 4/2003 | Kunihiro | ............... | H01F 21/12 |
| | | | | 361/277 |
| 2003/0162386 A1* | 8/2003 | Ogawa | ............... | H05K 3/4682 |
| | | | | 438/637 |
| 2003/0169134 A1* | 9/2003 | Ammar | ............... | H01L 24/49 |
| | | | | 333/247 |
| 2005/0024166 A1* | 2/2005 | Ammar | ............... | H04B 1/40 |
| | | | | 333/247 |
| 2007/0029667 A1* | 2/2007 | Fujii | ............... | H01Q 23/00 |
| | | | | 257/723 |
| 2008/0123309 A1* | 5/2008 | Kang | ............... | H05K 1/183 |
| | | | | 361/764 |
| 2008/0157340 A1* | 7/2008 | Yang | ............... | H01L 25/0655 |
| | | | | 257/691 |
| 2008/0157341 A1* | 7/2008 | Yang | ............... | H01L 24/82 |
| | | | | 257/700 |
| 2009/0091904 A1* | 4/2009 | Hatanaka | ............... | H03H 9/1021 |
| | | | | 361/764 |
| 2010/0078778 A1* | 4/2010 | Barth | ............... | H01L 23/585 |
| | | | | 257/659 |
| 2010/0307803 A1* | 12/2010 | Paul | ............... | H05K 3/4676 |
| | | | | 174/257 |
| 2010/0319981 A1* | 12/2010 | Kapusta | ............... | H05K 9/0043 |
| | | | | 174/350 |
| 2011/0156224 A1* | 6/2011 | Rokuhara | ............... | H01L 23/66 |
| | | | | 257/659 |
| 2011/0253439 A1* | 10/2011 | Huang | ............... | H05K 3/0097 |
| | | | | 174/262 |
| 2012/0235170 A1* | 9/2012 | Lee | ............... | H01J 9/24 |
| | | | | 445/25 |
| 2013/0113650 A1* | 5/2013 | Behbahani | ............... | G01S 13/89 |
| | | | | 342/175 |
| 2013/0113657 A1* | 5/2013 | Behbahani | ............... | H01Q 25/00 |
| | | | | 342/373 |
| 2013/0127562 A1* | 5/2013 | Purden | ............... | H01L 23/66 |
| | | | | 333/26 |
| 2013/0200516 A1* | 8/2013 | Nakatani | ............... | H01L 23/49811 |
| | | | | 257/737 |
| 2013/0207274 A1* | 8/2013 | Liu | ............... | H01Q 1/2283 |
| | | | | 257/774 |
| 2013/0324069 A1* | 12/2013 | Chen | ............... | H01L 24/97 |
| | | | | 455/334 |
| 2014/0145883 A1* | 5/2014 | Baks | ............... | H01Q 1/2283 |
| | | | | 343/700 MS |
| 2014/0176253 A1* | 6/2014 | Niman | ............... | H01Q 9/285 |
| | | | | 333/26 |
| 2015/0126134 A1* | 5/2015 | Lobianco | ............... | H04B 1/38 |
| | | | | 455/73 |
| 2015/0237712 A1* | 8/2015 | Tago | ............... | H01L 23/12 |
| | | | | 361/764 |
| 2016/0027665 A1* | 1/2016 | Li | ............... | H01L 21/76898 |
| | | | | 257/531 |
| 2016/0095224 A1* | 3/2016 | Chen | ............... | H05K 1/186 |
| | | | | 361/746 |
| 2016/0379943 A1* | 12/2016 | Mason | ............... | H01L 21/6835 |
| | | | | 257/506 |
| 2017/0018456 A1* | 1/2017 | Chowdhury | ......... | H01L 21/4857 |
| 2017/0092594 A1* | 3/2017 | Song | ............... | H01L 21/4853 |
| 2017/0154859 A1* | 6/2017 | Yap | ............... | H01L 23/5386 |
| 2017/0201291 A1* | 7/2017 | Gu | ............... | H01L 28/00 |
| 2017/0214386 A1* | 7/2017 | Kido | ............... | H03H 9/1014 |
| 2017/0245359 A1* | 8/2017 | Mu | ............... | H01L 23/13 |
| 2018/0044169 A1* | 2/2018 | Hatcher, Jr. | ............. | H01L 24/24 |
| 2018/0159203 A1* | 6/2018 | Baks | ............... | H01Q 1/2283 |
| 2018/0218922 A1* | 8/2018 | Darveaux | ............... | H01L 21/268 |
| 2018/0219272 A1* | 8/2018 | Baheti | ............... | H01Q 9/0407 |
| 2018/0240797 A1* | 8/2018 | Yokoyama | ............. | H01L 23/552 |
| 2018/0242456 A1* | 8/2018 | Gottwald | ............... | H05K 1/181 |
| 2018/0323159 A1* | 11/2018 | Kamgaing | ............. | H01L 24/16 |
| 2018/0331051 A1* | 11/2018 | Dogiamis | ............. | H01L 23/3107 |
| 2018/0350772 A1* | 12/2018 | Nair | ............... | H01Q 1/38 |
| 2019/0221917 A1* | 7/2019 | Kim | ............... | H01L 23/66 |
| 2019/0252772 A1* | 8/2019 | Ndip | ............... | H01Q 1/2283 |
| 2019/0267361 A1* | 8/2019 | Rahim | ............... | H03H 9/175 |
| 2019/0280374 A1* | 9/2019 | Kim | ............... | H01L 23/5389 |
| 2019/0304936 A1* | 10/2019 | Shaul | ............... | H01L 25/16 |
| 2019/0305402 A1* | 10/2019 | Dalmia | ............... | H01Q 1/2283 |
| 2019/0352069 A1* | 11/2019 | Chen | ............... | B65D 75/5833 |
| 2020/0006235 A1* | 1/2020 | Aleksov | ............... | H01L 24/17 |

(56) References Cited

U.S. PATENT DOCUMENTS

| | | | |
|---|---|---|---|
| 2020/0021046 A1* | 1/2020 | Kermalli | H01R 12/707 |
| 2020/0066663 A1* | 2/2020 | Aleksov | H01L 23/3121 |
| 2020/0067188 A1* | 2/2020 | Pu | H01Q 21/28 |
| 2020/0067459 A1* | 2/2020 | Ahmed | H01L 23/49811 |
| 2020/0075514 A1* | 3/2020 | Verma | H01L 23/66 |
| 2020/0098710 A1* | 3/2020 | Nair | H01L 23/66 |
| 2020/0189954 A1* | 6/2020 | Miyake | E06B 3/677 |
| 2020/0253040 A1* | 8/2020 | Dalmia | H01L 25/18 |
| 2020/0259267 A1* | 8/2020 | Park | H01Q 21/0025 |
| 2020/0259269 A1* | 8/2020 | Kim | H01Q 1/521 |
| 2020/0273839 A1* | 8/2020 | Elsherbini | H01L 25/50 |
| 2020/0279829 A1* | 9/2020 | Elsherbini | H01L 25/065 |
| 2020/0303822 A1* | 9/2020 | Yao | H01L 23/49816 |
| 2020/0402698 A1* | 12/2020 | Tiemeijer | H01L 23/5283 |
| 2020/0413544 A1* | 12/2020 | Gao | H01Q 1/2283 |
| 2021/0044030 A1* | 2/2021 | Aleksov | H01Q 23/00 |
| 2021/0050312 A1* | 2/2021 | Franson | H01L 23/49816 |
| 2021/0057817 A1* | 2/2021 | Lenive | H01Q 3/36 |
| 2021/0098320 A1* | 4/2021 | Garcia | H01L 23/49894 |
| 2021/0098407 A1* | 4/2021 | Elsherbini | H01L 25/18 |
| 2021/0134733 A1* | 5/2021 | Tarui | H01L 23/5383 |
| 2021/0193519 A1* | 6/2021 | Aleksov | H01L 25/16 |

OTHER PUBLICATIONS

Geise et al., "Packaging of Antenna Modules for Digital Beam Forming at Ka-Band", The Second European Conference on Antennas and Propagation, EuCAP 2007, Nov. 11-16, 2007, Conference Location:Edinburgh, UK, 5 pages.

* cited by examiner

SYSTEMS AND METHODS FOR HYBRID GLASS AND ORGANIC PACKAGING FOR RADIO FREQUENCY ELECTRONICS

BACKGROUND

The field of the invention relates generally to radio frequency (RF) electronics packaging, and more particularly, to a hybrid packaging architecture including glass and organic substrate materials.

Millimeter band RF circuits are increasingly common due to the proliferation of applications such as 5G cellular network technology. Such RF circuits require packaging that is reliable, easy to manufacture and reproduce, and resistant to environmental changes, and packaging that has favorable RF properties (e.g., low electrical loss). While using a glass substrate in an RF device is known to provide some of these benefits, RF devices that use glass substrates generally are not integrated into packaging that is durable and that facilitates a variety of different RF applications. An improved electronics package for millimeter band RF devices is therefore desirable.

BRIEF DESCRIPTION

In one aspect, an electronics package is disclosed. The electronics package includes a first RF substrate layer, a second RF substrate layer, and a plurality of conductive layers disposed adjacent to at least one of the first RF substrate layer and the second RF substrate layer and including an inner conductive layer disposed between and adjacent to both the first RF substrate layer and the second RF substrate layer. The inner conductive layer bonds the first RF substrate layer to the second RF substrate layer. The electronics package also includes a plurality of conductive interconnects extending through the first RF substrate layer and the second RF substrate layer and electrically coupled between at least two of the plurality of conductive layers.

In another aspect, a radio frequency (RF) structure is disclosed. The RF structure includes a first RF substrate layer, at least one conductive layer disposed adjacent to the first RF substrate layer. The at least one conductive layer bonds the first RF substrate layer to a second RF substrate layer. The RF structure further includes a plurality of conductive interconnects extending through the first RF substrate layer and electrically coupled to the at least one conductive layer.

In another aspect, a method of manufacturing an electronics package is disclosed. The method includes forming, in a first RF substrate layer and a second RF substrate layer, a plurality of conductive interconnects extending through the first RF substrate layer and the second RF substrate layer and configured to be electrically coupled between at least two of a plurality of conductive layers formed on the first RF substrate layer and the second RF substrate layer. The method further includes forming, on the first RF substrate layer and the second RF substrate layer, the plurality of conductive layers. A first conductive layer on a bottom surface of the first RF substrate layer aligns at least in part with a second conductive layer on a top surface of the second RF substrate layer. The method further includes attaching the first RF substrate layer to the second RF substrate layer by bonding the first conductive layer to the second conductive layer. The plurality of conductive layers and the plurality of conductive interconnects form an RF circuit.

DRAWINGS

These and other features, aspects, and advantages of the present disclosure will become better understood when the following detailed description is read with reference to the accompanying drawings in which like characters represent like parts throughout the drawings, wherein.

DETAILED DESCRIPTION

In the following specification and the claims, reference will be made to a number of terms, which shall be defined to have the following meanings.

The singular forms "a", "an", and "the" include plural references unless the context clearly dictates otherwise.

Approximating language, as used herein throughout the specification and claims, may be applied to modify any quantitative representation that could permissibly vary without resulting in a change in the basic function to which it is related. Accordingly, a value modified by a term or terms, such as "about," "substantially," and "approximately," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

Figure 1:
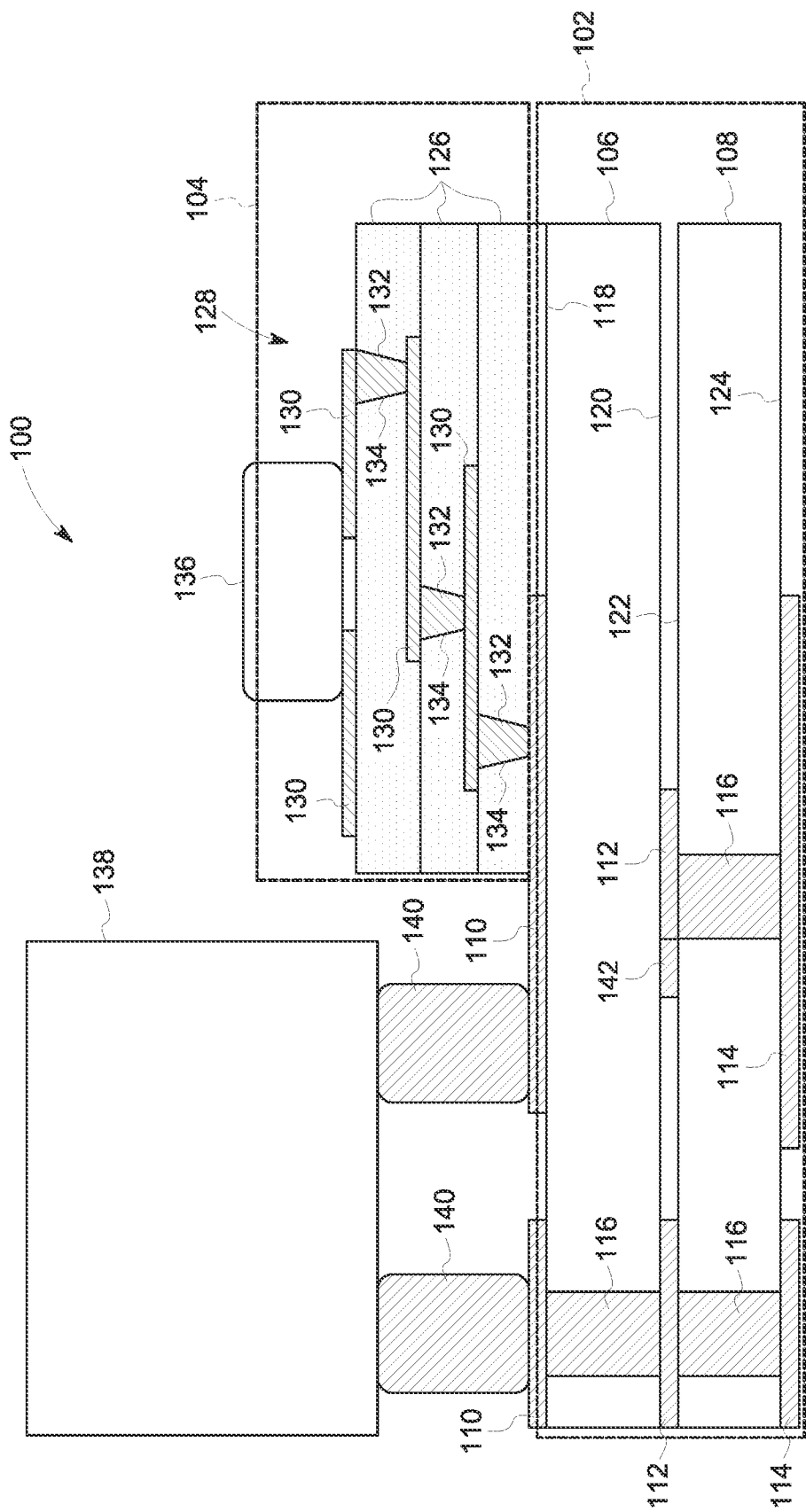
FIG. 1 depicts a cross-sectional view of an exemplary electronics package.

FIG. 1 depicts a cross-sectional view of an exemplary electronics package 100. Electronics package 100 includes a radio frequency (RF) structure 102 and an overlay structure 104. RF structure 102 forms an RF circuit device and includes a first RF substrate layer 106, a second RF substrate layer 108, a first outer conductive layer 110, an inner conductive layer 112, a second outer conductive layer 114, and a plurality of interconnects 116. Overlay structure 104 includes circuitry for digital and power routing for RF structure 102.

First RF substrate layer 106 has a first surface 118 and a second surface 120 (sometimes referred to herein as the "bottom surface" of first RF substrate layer 106). Second RF substrate layer 108 has a third surface 122 (sometimes referred to herein as the "top surface" of second RF substrate layer 108) and a fourth surface 124. First outer conductive layer 110 is disposed on first surface 118. Inner conductive layer 112 is disposed between first RF substrate layer 106 and second RF substrate layer 108 and on second surface 120 and third surface 122. Second outer conductive layer 114 is disposed on fourth surface 124. First outer conductive layer 110, inner conductive layer 112, and second outer conductive layer 114 are attached to the adjacent surfaces on which they are disposed. For example, inner conductive layer 112 forms a connection between second surface 120 and third surface 122, fixing first RF substrate layer 106 and second RF substrate layer 108 together. In some embodiments, portions of inner conductive layer 112 may be disposed on only one of first RF substrate layer 106 and second RF substrate layer 108. Such portions may be, for example, a routing layer including routing circuitry for RF structure 102. Such routing circuitry may include, for example, integral passive components 142 such as capacitors, inductors, and resistors.

In some embodiments, RF structure includes any number of additional RF substrate layers that function similar to first RF substrate layer 106 and second RF substrate layer 108. For example, the additional RF substrate layers may be stacked adjacent to fourth surface 124 of second RF substrate layer 108. In such embodiments, additional conductive layers are formed on surfaces of the additional RF substrate layers and may form at least in part a bond between the additional RF substrate layers.

In some embodiments, first RF substrate layer 106 and/or second RF substrate layer 108 are made of a glass material, such as, for example, fused silica, another silicate glass, quartz, and/or alumina ribbon. Glass is relatively inflexible, relatively uniform in thickness, and has a relatively low coefficient of thermal expansion (CTE) compared to other substrate materials such as organic materials. Accordingly, first RF substrate layer 106 and second RF substrate layer 108 provide a more stable and reliable substrate for high-fidelity RF applications. Additionally or alternatively, first RF substrate layer 106 and/or second RF substrate layer 108 may be made of a different material, such as, for example, ceramic. In some embodiments, materials for first RF substrate layer 106 and second RF substrate layer 108 may be selected based at least in part on a CTE of the material, for example, to mitigate stress due to thermal expansion of components of electronics package 100. In some embodiments, at least one of first RF substrate layer 106, second RF substrate layer 108, and/or an additional substrate layer is an integral high dielectric constant layer that is formed from, for example, an alumina ribbon. In some embodiments, first RF substrate layer 106 and second RF substrate layer 108 include vias, through which interconnects 116 extend. In some embodiments, first RF substrate layer 106 and/or second RF substrate layer 108 have a thickness that is between 50 and 500 micrometers.

First outer conductive layer 110, inner conductive layer 112, second outer conductive layer 114, and interconnects 116 are formed from a conductor such as, for example, gold, aluminum, copper, and/or another metal. First outer conductive layer 110, inner conductive layer 112, second outer conductive layer 114, and interconnects 116 form a RF circuit, such as, for example, a beamformer, a directional coupler, a filter, a patch antenna, a radio transmitter or receiver, a power divider, and/or any combination of these or similar circuits. In some embodiments, first outer conductive layer 110 and second outer conductive layer 114 are ground planes and inner conductive layer 112 forms an active conductor of the RF circuit.

In some embodiments, first outer conductive layer 110, inner conductive layer 112, and second outer conductive layer 114 are formed directly on respective adjacent surfaces with no additional bonding layer. For example, first outer conductive layer 110, inner conductive layer 112, and second outer conductive layer 114 can be printed or deposited onto respective surfaces of first RF substrate layer 106 and/or second RF substrate layer 108. In some embodiments, first outer conductive layer 110, inner conductive layer 112, and second outer conductive layer 114 are printed onto respective surfaces using a photolithography process.

In some embodiments, inner conductive layer 112 is printed or deposited onto both second surface 120 of first RF substrate layer 106 and third surface 122 of second RF substrate layer 108 prior to assembly of RF structure 102. First RF substrate layer 106 and second RF substrate layer 108 may then be attached by bonding the respective printed or deposited inner conductive layers 112 using, for example, low temperature brazing, soldering, or thermo-compression bonding. As such, inner conductive layer 112 forms a bond between first RF substrate layer 106 and second RF substrate layer 108, and no additional material is necessary to bond first RF substrate layer 106 and second RF substrate layer 108.

Overlay structure 104 includes a plurality of organic substrate layers 126, and overlay circuitry 128. Overlay circuitry 128 includes a plurality of wiring layers 130 and overlay interconnects 132 and be formed, for example, using a power overlay (POL) process or a build-up process equivalent. In some embodiments, overlay circuitry 128 is configured to provide, power, digital logic, and/or RF interconnection to RF structure 102.

Organic substrate layers 126 are a dielectric material such as, for example, Kapton®, Ultem®, polytetrafluoroethylene (PTFE), Upilex®, polysulfone materials (e.g., Udel®, Radel®), or another polymer film, such as, for example, a liquid crystal polymer (LCP), a polyimide material, Panasonic Megtron 6, Rogers 2929 Bondply, benzocyclobutene (BCB) films, and/or Ajinomoto Build-up Film GY-11. Organic substrate layers 126 are flexible to provide robustness against thermal cycling or shock due to, for example, CTE mismatch with the RF substrate layers. Organic substrate layers 126 are stacked on one another to form overlay structure 104 with a desired thickness. In some embodiments, adhesive is provided between the stacked organic substrate layers 126. Wiring layers 130 include conductive traces and are formed on surfaces of organic substrate layers 126, for example, through a printing or metallization (e.g., sputtering) process. Organic substrate layers 126 define a plurality of vias 134 that extend through the corresponding organic substrate. Overlay interconnects 132 are formed in vias 134 and provide an electrical connection through organic substrate layers 126. Overlay interconnects 132 are formed in vias 134, for example, through a metallization (e.g., sputtering) process. Wiring layers 130 and overlay interconnects 132 are formed from a conductor such as, for example, gold, aluminum, copper, or another metal.

In some embodiments, overlay structure 104 are formed by bonding one organic substrate layer 126 to first surface 118 of first RF substrate layer 106 and then stacking additional organic substrate layers 126 onto the first organic substrate layer 126. Alternatively, a plurality of organic substrate layers 126 can be stacked to form overlay structure 104 prior to bonding overlay structure 104 to first RF substrate layer 106. Overlay structure 104 can be bonded to first RF substrate layer 106, for example, by soldering or using an adhesive. In some embodiments, electronics package 100 includes any number of additional overlay structures 104 disposed, for example, on an outer surface of RF structure 102 such as first surface 118 and/or fourth surface 124.

In some embodiments, overlay structure 104 includes surface mount technology (SMT) 136. SMT 136 is disposed on a topmost organic substrate layer 126 and electrically coupled to overlay circuitry 128. SMT 136 can include, for example, connectors and/or passive electronic components (e.g., capacitors, inductors, resistors).

In some embodiments, electronics package 100 includes an RF die 138 electrically coupled to at least one of first outer conductive layer 110, inner conductive layer 112, and/or second outer conductive layer 114. RF die 138 is coupled to RF structure 102 via die interconnects 140, such as, for example, a gold stud bump, a solder flip chip, and/or a wirebond interconnect. In some embodiments, RF die 138 is a microelectromechanical systems (MEMS) device (e.g., a MEMS switch), a low-noise amplifier (LNA), and/or a monolithic microwave integrated circuit (MMIC). While FIG. 1 depicts RF die 138 as disposed on first surface 118 of first RF substrate layer 106, in other embodiments, RF die 138 may be disposed on another surface of a layer of RF structure 102 and/or embedded between two layers of RF structure 102. For example, RF die 138 may be embedded between first RF substrate layer 106 and second RF substrate layer 108.

Figure 2:
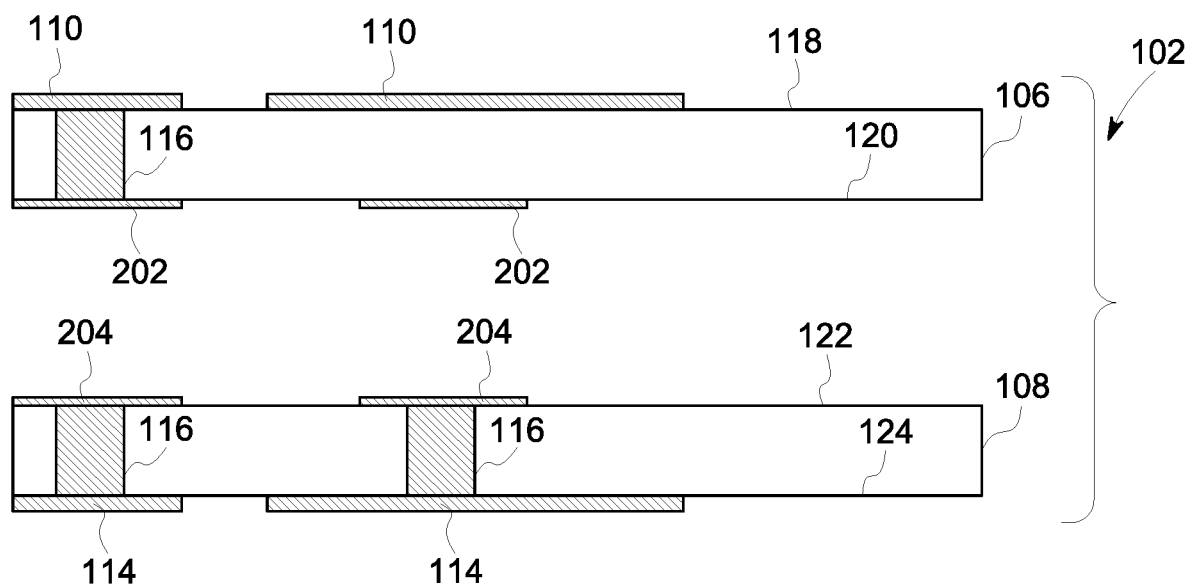
FIG. 2 depicts an exploded cross-sectional view of an exemplary radio frequency (RF) structure prior to assembly.

FIG. 2 depicts an exploded view of an exemplary RF structure 102 prior to assembly. RF structure 102 includes first RF substrate layer 106, second RF substrate layer 108, first outer conductive layer 110, and second outer conductive layer 114, which generally function as described with respect to FIG. 1. RF structure 102 further includes a first inner conductive layer 202 disposed on second surface 120 of first RF substrate layer 106 and a second inner conductive layer 204 disposed on third surface 122 of second RF substrate layer 108. In some embodiments, first inner conductive layer 202 and second inner conductive layer 204 are formed through a printing or metallization process. First inner conductive layer 202 and second inner conductive layer 204 correspond to each other in that first inner conductive layer 202 and second inner conductive layer 204 can be combined to bond first RF substrate layer 106 and second RF substrate layer 108 and form a single inner conductive layer 112 (shown in FIG. 1). First inner conductive layer 202 and second inner conductive layer 204 can be combined, for example, through low temperature brazing, soldering, or thermo-compression bonding. In some embodiments, portions of first inner conductive layer 202 and second inner conductive layer 204 do not make contact with each other. Such portions may be, for example, a routing layer including routing circuitry for RF structure 102.

Figure 3:
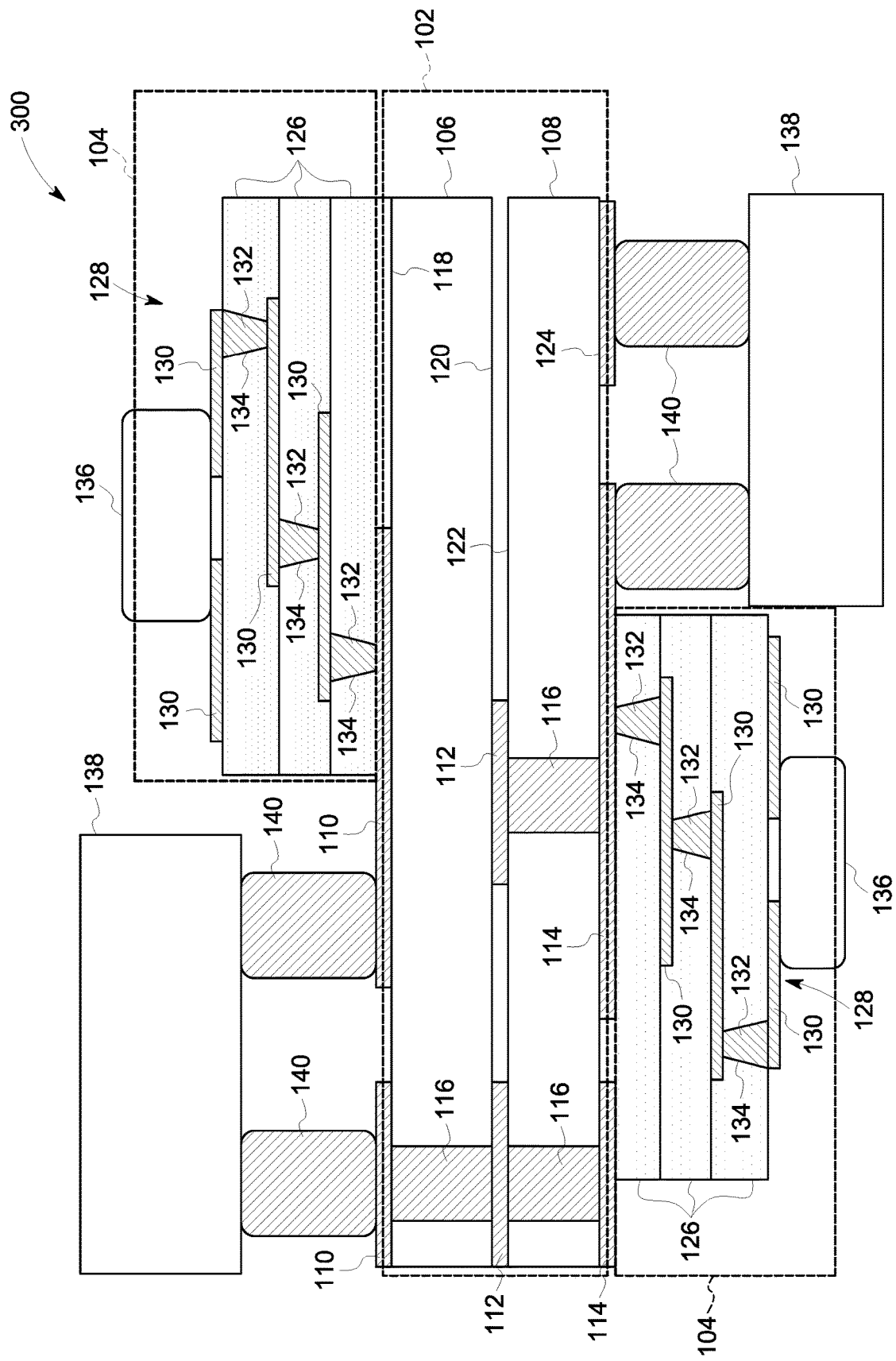
FIG. 3 depicts a cross-sectional view of another exemplary electronics package.

FIG. 3 depicts a cross-sectional view of an electronics package 300. Electronics package 300 includes RF structure 102, overlay structure 104, and RF die 138, which generally function as described with respect to FIG. 1. Electronics package further includes an additional overlay structure 104 and RF die 138 disposed on fourth surface 124. In other embodiments, electronics package 300 may include any number of additional overlay structures 104 and/or RF dies 138. Such overlay structures 104 and/or RF dies 138 may be disposed on a top or a bottom surface of RF structure 102, embedded within RF structure 102, and/or otherwise attached to RF structure 102.

Figure 4:
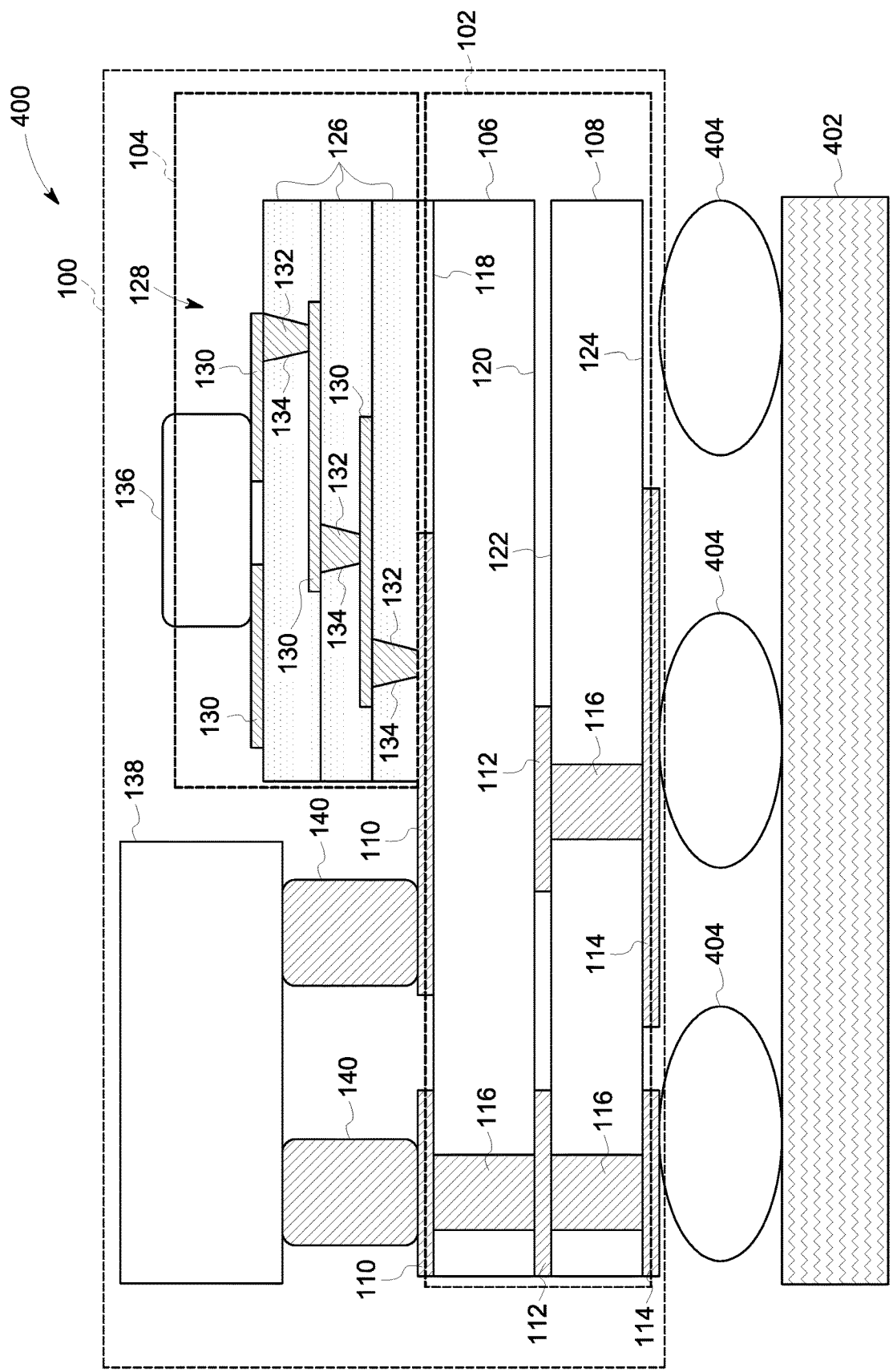
FIG. 4 depicts a cross-sectional view of an exemplary second-level assembly architecture for the electronics package illustrated in FIG. 1.

FIG. 4 depicts a cross-sectional view of an exemplary second-level assembly architecture 400. Second-level assembly architecture includes electronics package 100 (shown in FIG. 1), a second-level substrate 402, and a plurality of solder balls 404. Solder balls 404 form a ball grid array that bonds electronics package 100 to second-level substrate 402. In alternative embodiment, other materials and/or structures may be used to attach electronics package 100 to second-level substrate 402.

In some embodiments, the components of second-level assembly architecture 400 may have a graded CTE to reduce strain on second-level assembly architecture 400 due to thermal expansion. For example, in some embodiments, RF die 138 and first RF substrate layer 106 may have a linear CTE of 2 and second-level substrate 402 may have a linear CTE of 16. In such embodiments, a material having a linear CTE between 2 and 16 may be selected for second RF substrate layer 108 in order to reduce stress caused by thermal expansion. For example, second RF substrate layer 108 may be formed from a ceramic having a linear CTE of 9.

Figure 5:
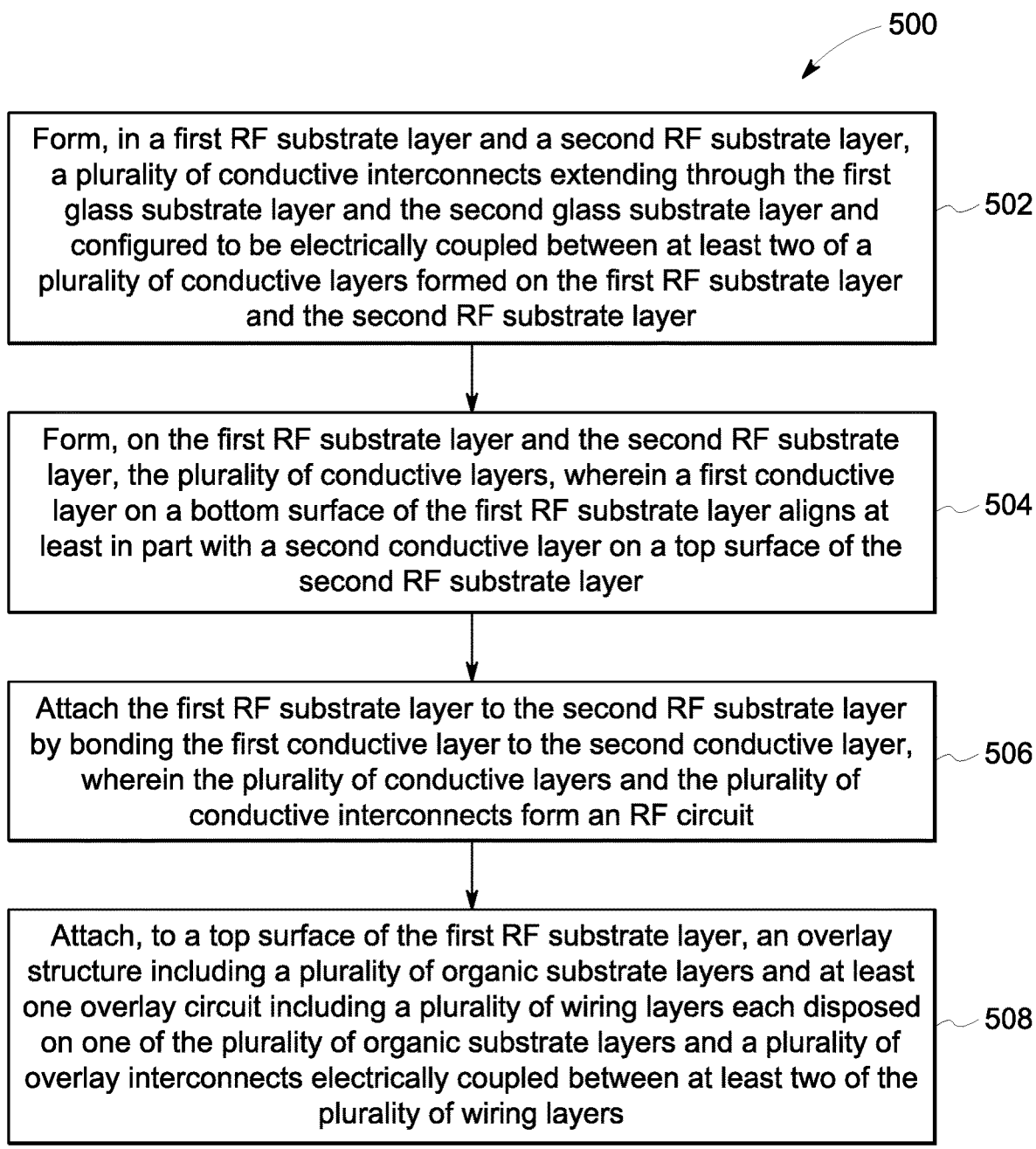
FIG. 5 depicts an exemplary method for manufacturing an electronics package.

FIG. 5 depicts an exemplary method 500 of manufacturing electronics package 100 (shown in FIG. 1). Method 500 includes forming 502, in a first RF substrate layer and a second RF substrate layer, a plurality of conductive interconnects extending through the first RF substrate layer and the second RF substrate layer and configured to be electrically coupled between at least two of a plurality of conductive layers formed on the first RF substrate layer and the second RF substrate layer.

Method 500 further includes forming 504, on the first RF substrate layer and the second RF substrate layer, the plurality of conductive layers, wherein a first conductive layer on a bottom surface of the first RF substrate layer aligns at least in part with a second conductive layer on a top surface of the second RF substrate layer. In some embodiments, the conductive layers are printed through a photolithography process.

Method 500 further includes attaching 506 the first RF substrate layer to the second RF substrate layer by bonding the first conductive layer to the second conductive layer, wherein the plurality of conductive layers and the plurality of conductive interconnects form an RF circuit. In some embodiments, first conductive layer is bonded to the second conductive layer through one of low temperature brazing, soldering, adhesive displacement, or thermo-compression bonding.

In some embodiments, method 500 further includes attaching 508, to a top surface of the first RF substrate layer, an overlay structure including a plurality of organic substrate layers and at least one overlay circuit including a plurality of wiring layers each disposed on one of the plurality of organic substrate layers and a plurality of overlay interconnects electrically coupled between at least two of the plurality of wiring layers. In some such embodiments, the overlay structure is attached to the first RF substrate layer by soldering the overlay structure to the first RF substrate layer. In some such embodiments, the overlay structure is fabricated prior to attaching the overlay structure to the first RF substrate layer.

In some embodiments, method 500 further includes electrically coupling at least one component to at least one of the plurality of conductive layers via a die interconnect. In some such embodiments, the at least one component is an RF die.

The embodiments described herein include an electronics package including a first radio frequency (RF) substrate layer, a second RF substrate layer, and a plurality of conductive layers disposed adjacent to at least one of the first RF substrate layer and the second RF substrate layer and including an inner conductive layer disposed between and adjacent to both the first RF substrate layer and the second RF substrate layer. The inner conductive layer bonds the first RF substrate layer to the second RF substrate layer. The electronics package also includes a plurality of conductive interconnects extending through the first RF substrate layer and the second RF substrate layer and electrically coupled between at least two of the plurality of conductive layers.

An exemplary technical effect of the methods, systems, and apparatus described herein includes at least one of: (a) providing a reliable electronics package by including a plurality RF substrate layers for high-fidelity radio frequency (RF) circuitry and organic substrate layers for overlay circuitry such as power and digital logic interconnects; and (b) simplifying the process of manufacturing an electronics package including glass substrates by using a conductive layer forming part of an RF circuit as a bond to attach multiple RF substrate layers.

Exemplary embodiments of a hybrid electronics package are described herein. The systems and methods of operating and manufacturing such systems and devices are not limited to the specific embodiments described herein, but rather, components of systems and/or steps of the methods may be utilized independently and separately from other components and/or steps described herein. For example, the methods may also be used in combination with other electronic systems, and are not limited to practice with only the electronic systems, and methods as described herein. Rather, the exemplary embodiment can be implemented and utilized in connection with many other electronic systems.

Although specific features of various embodiments of the disclosure may be shown in some drawings and not in others, this is for convenience only. In accordance with the principles of the disclosure, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. An electronics package comprising:
    a first radio frequency (RF) substrate layer;
    a second RF substrate layer;
    a plurality of conductive layers disposed adjacent to at least one of said first RF substrate layer and said second RF substrate layer and comprising an inner conductive layer disposed between and adjacent to both said first RF substrate layer and said second RF substrate layer, wherein said inner conductive layer forms a bond between said first RF substrate layer and said second RF substrate layer, and wherein said first RF substrate layer, said second RF substrate layer, and said inner conductive layer define an empty space therebetween; and
    a plurality of conductive interconnects extending through said first RF substrate layer and said second RF substrate layer and electrically coupled between at least two of said plurality of conductive layers.

2. The electronics package of claim 1, further comprising:
    a plurality of organic substrate layers disposed on said first RF substrate layer;
    at least one overlay circuit electrically coupled to at least one conductive layer of said plurality of conductive layers and comprising a plurality of wiring layers, each wiring layer of said plurality of wiring layers disposed on one organic substrate layer of said plurality of organic substrate layers; and
    a plurality of overlay interconnects electrically coupled between at least two wiring layers of said plurality of wiring layers.

3. The electronics package of claim 2, wherein said first RF substrate layer, said second RF substrate layer, and said plurality of organic substrate layers have coefficients of thermal expansion respectively graded to reduce an amount of stress due to thermal expansion of said first RF substrate layer, said second RF substrate layer, and said plurality of organic substrate layers.

4. The electronics package of claim 1, further comprising at least one additional RF substrate layer.

5. The electronics package of claim 1, wherein said first RF substrate layer and said second RF substrate layer comprise fused silica.

6. The electronics package of claim 1, further comprising an RF die electrically coupled to at least one of said plurality of conductive layers via a die interconnect.

7. The electronics package of claim 6, wherein said RF die is disposed on a surface of at least one of said first RF substrate layer and said second RF substrate layer.

8. The electronics package of claim 1, wherein at least one of said first RF substrate layer and/or said second RF substrate layer comprises a high dielectric constant layer.

9. The electronics package of claim 8, wherein said high dielectric constant layer comprises alumina ribbon.

10. The electronics package of claim 1, wherein said first RF substrate layer and said second RF substrate layer each have a thickness of between 50 and 500 micrometers.

11. The electronics package of claim 1, wherein said plurality of conductive layers and said plurality of conductive interconnects form at least one of a beamformer, a directional coupler, a filter, a patch antenna, a radio transmitter or receiver, and/or a power divider.

12. The electronics package of claim 1, wherein said plurality of conductive layers are formed directly on one of said first RF substrate layer or said second RF substrate layer with no additional bonding layer.

13. The electronics package of claim 1, wherein said inner conductive layer is formed by bonding two conductive layers.

14. The electronics package of claim 13, wherein the two conductive layers are bonded using one of low-temperature brazing, soldering, or thermo-compression bonding.

* * * * *